(12) United States Patent  
Tertinek

(10) Patent No.: US 8,873,699 B2  
(45) Date of Patent: Oct. 28, 2014

(54) FRACTIONAL FREQUENCY DIVIDER WITH PHASE PERMUTATION

(71) Applicant: Intel Mobile Communications GmbH, Neubiberg (DE)

(72) Inventor: Stefan Tertinek, Linz (AT)

(73) Assignee: Intel Mobile Communications GmbH, Neubiberg (DE)

( * ) Notice: Subject to any disclaimer, the term of this patent is extended or adjusted under 35 U.S.C. 154(b) by 21 days.

(21) Appl. No.: 13/683,787

(22) Filed: Nov. 21, 2012

(65) Prior Publication Data

US 2014/0139272 A1 May 22, 2014

(51) Int. Cl.  
*H03K 21/00* (2006.01)

(52) U.S. Cl.  
CPC .................................. *H03K 21/00* (2013.01)  
USPC .............................. 377/48; 327/115; 327/117

(58) Field of Classification Search  
CPC ... H03K 23/665; H03K 23/667; H03K 23/68; G06F 7/68; G06F 1/08  
USPC ............... 327/113–115, 117, 118; 377/47, 48  
See application file for complete search history.

(56) References Cited

U.S. PATENT DOCUMENTS

| | | | |
|---|---|---|---|
| 6,535,989 B1* | 3/2003 | Dvorak et al. | 713/500 |
| 6,600,355 B1* | 7/2003 | Nguyen | 327/298 |
| 7,043,202 B2* | 5/2006 | Ozawa et al. | 455/23 |
| 2012/0313674 A1* | 12/2012 | Malmcrona et al. | 327/117 |

* cited by examiner

*Primary Examiner* — Patrick O'Neill  
(74) *Attorney, Agent, or Firm* — Eschweiler & Associates, LLC

(57) ABSTRACT

Some embodiments of the present disclosure relate to a fractional divider for frequency generation. The fractional divider includes a permutation network including a plurality of phase input terminals and a plurality of permuted phase output terminals with a plurality of propagation paths extending therebetween. Multiple propagation paths extend between a phase input terminal and a permuted phase output terminal. A control unit switches an input signal on the phase input terminal through the multiple propagation paths in time to produce a permuted phase signal on the permuted phase output terminal. A phase selection element individually switches the permuted phase output terminals to an output terminal of the fractional divider in time to generate an output signal. The output signal has an output frequency that is a non-unity fraction of an input frequency of the input signal.

18 Claims, 5 Drawing Sheets

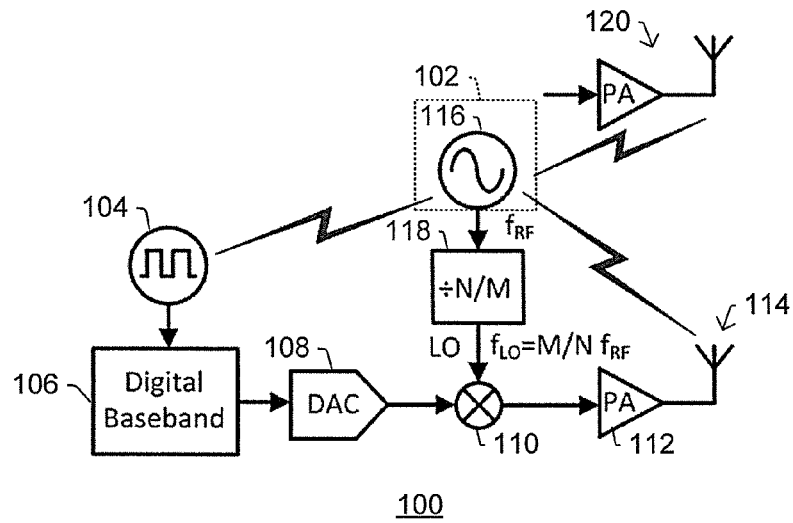
Fig. 1
(PRIOR ART)
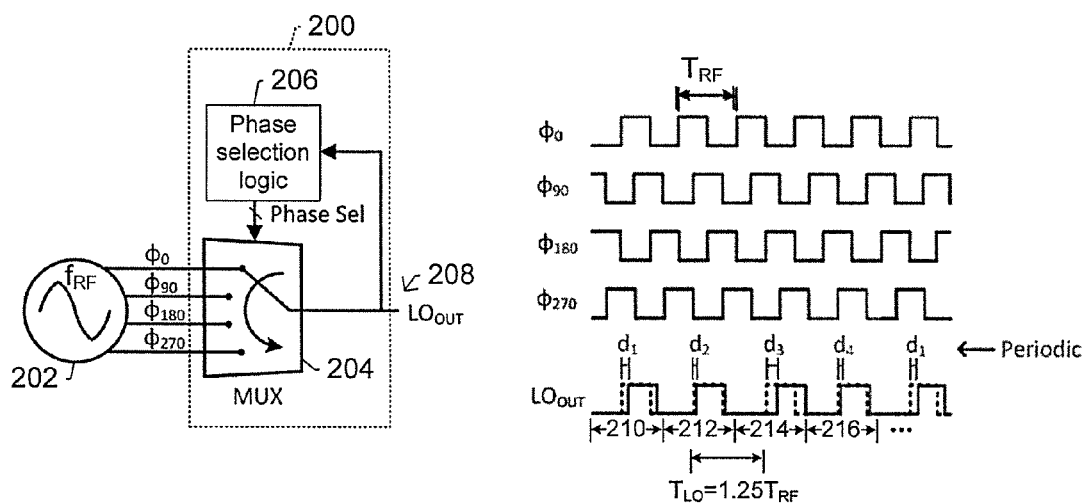
Fig. 2A
(PRIOR ART)
Fig. 2B
(PRIOR ART)

FRACTIONAL FREQUENCY DIVIDER WITH PHASE PERMUTATION

BACKGROUND

A core building block of modern wireless transceivers is radio frequency (RF) synthesizers, which are used to synthesize channel frequencies used during wireless communication. Conventional RF synthesizers for multi-mode and multi-band operation are based on fractional dividers, which are able to synthesize output frequencies that are a fractional multiple of an input frequency. Unfortunately, conventional fractional dividers are less than ideal for several reasons.

BRIEF DESCRIPTION OF THE DRAWINGS

FIG. 1 illustrates a radio frequency (RF) transceiver that includes an RF synthesizer which is susceptible to frequency pulling.

FIGS. 2A-2B illustrate operation of a fractional frequency divider that uses phase rotation to generate a local oscillator (LO) signal that is a fractional multiple of an input frequency.

DETAILED DESCRIPTION

Figure 3:
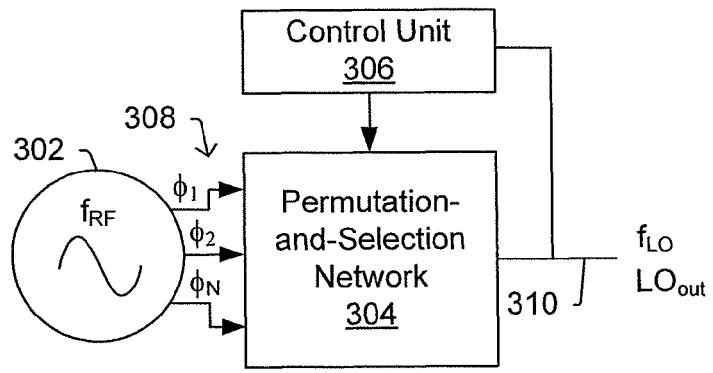
FIG. 3 illustrates an example fractional frequency divider in accordance with some aspects of the disclosure.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one skilled in the art, that one or more aspects described herein may be practiced with a lesser degree of these specific details. In other instances, known structures and devices are shown in block diagram form to facilitate understanding.

FIG. 1 illustrates a wireless transmitter 100 with an RF synthesizer 102 that is susceptible to interference. The wireless transmitter 100 includes an on-chip clock module 104, a digital baseband processor 106, a digital to analog converter (DAC) 108, a frequency conversion element 110, a power amplifier (PA) 112, and an RF antenna 114; which are operably coupled as shown. The RF synthesizer 102 includes a voltage controlled oscillator (VCO) or digitally controlled oscillator (DCO) 116, which is typically operated in a phase-locked loop, and is connected to a programmable divider 118.

During wireless communication, the VCO/DCO 116 provides an input RF frequency, $f_{RF}$, and the divider 118 performs fractional multiplication or division on the input RF frequency to provide an LO signal having a LO frequency, which is a fractional multiple (N/M) of the input RF frequency. Consider an example where N=3 and M=2. In such a case, if $f_{RF}$ has a fixed reference frequency of 2 GHz, the RF synthesizer would output an LO frequency of 3 GHz. The ratio N/M can be changed in time to correspond to different integer multiples and/or fractional multiples, thereby tuning the LO frequency to facilitate communication over different frequency channels in time.

When this transmitter 100 is implemented as a highly integrated direct-conversion wireless transceiver, noise from several sources can cause interference (so-called "frequency pulling" or "oscillator pulling") for the VCO or DCO 116. These noise sources can include the output signal of the antenna 114, the on-chip digital clock 104, as well as other nearby transmitters 120.

Having a fractional divider 118 connected between the RF synthesizer 102 and the LO output is one way to limit the effect of frequency pulling in FIG. 1's wireless transmitter 100, due to the fractional ratio between the output LO frequency, $f_{LO}$, and the input RF frequency, $f_{RF}$. A phase-rotating fractional divider is one type of fractional divider which can be convenient in many applications because it can be amenable to digital reconfiguration and calibration, which allows on-the-fly adjustment of the transmitter's local oscillator (LO) frequency.

FIGS. 2A-2B illustrate the working principle of a phase-rotating fractional divider 200, which suffers from some shortcomings, in the context of achieving fractional division by 1.25.

In FIG. 2A, RF synthesizer 202 provides quadrature signals $\phi_0$, $\phi_{90}$, $\phi_{180}$ and $\phi_{270}$ to phase rotating fractional divider 200. These quadrature signals share a common RF frequency (e.g., $f_{RF}=1/T_{RF}$), but have phases that are offset by 90° relative to one another as indicated by their respective indices. The quadrature signals are fed into a multiplexer (MUX) 204, which is under control of phase selection logic 206. The MUX 204 (under direction of phase selection logic 206) rotates which quadrature signal is passed through to an LO output 208 in time. For example, as shown in FIG. 2B, at a first time window 210 ($\phi_0$ is passed through to the LO output; at a second time window 212 $\phi_{90}$ is passed through to the LO output; at a third time window 214 $\phi_{180}$ is passed through to the LO output; at a fourth time window 216 $\phi_{270}$ is pass through to the LO output; and so on in periodic fashion. Each phase rotation momentarily slows down the output LO signal by adding a quarter-length period of the input signal, such that the LO frequency output from the fractional divider is equal to $f_{LO}=f_{RF}/1.25$. In other words, fractional division of the input quadrature signal is achieved in that the output LO frequency, $f_{LO}$, is four-fifths of the input RF frequency, $f_{RF}$.

Unfortunately, a problem with the phase-rotating fractional divider shown in FIGS. 2A-2B is that delay mismatch between the quadrature signals when passing through the MUX 204 leads to fractional spurs at the LO output 208, thus degrading the LO signal's spectral purity. The delay mismatch is represented by unequal propagation delays $d_1$ to $d_4$ through the MUX 204, wherein the propagation delays d1 to d4 are slightly different from one another, as shown in FIG. 2B, due to slight differences between paths through the MUX 204. Because these propagation delays d1 through d4 repeat periodically (corresponding to the pattern of rotation used for MUX 204), this periodic sequence causes undesired noise in the form of fractional spurs having frequencies $f_{LO}+k*f_{LO}/4$, where k is an integer. Delay mismatch can be caused by unequal propagation time of the input phases through the MUX 204, but might also be inherent in the multi-phase quadrature signal from the RF synthesizer 202. For instance, if the multi-phase quadrature signal is generated by a ring oscillator, then mismatch among the delay elements in the ring can lead to unequally spaced output phases.

When a phase-rotating fractional divider such as shown in FIGS. 2A-2B is used for LO generation in a wireless transceiver (e.g., wireless transceiver of FIG. 1), the fractional spurs can cause problems in the transmission or reception paths. For example, in the transmission path, the fractional spurs might cause "spikes" at the fractional spurs' frequencies in the transmission power spectrum, and these "spikes" might violate output requirements for spectral masks defined by various communication standards. In the reception path, in contrast, the fractional spurs might down-convert undesired channels. This undesired down-conversion can cause received constellation points to deviate from their ideal locations, thereby degrading the error vector magnitude (EVM) of the transceiver.

To limit these problems, the phase-rotating fractional divider of the present disclosure scrambles or randomizes the delay mismatch such that the periodic phase-error pattern (e.g., illustrated by periodic pattern d1 to d4 in FIG. 2B) at the LO output is broken, which limits or prevents fractional spurs from occurring.

FIG. 3 shows an example of a phase-rotating fractional frequency divider 300 in accordance with this disclosure. The fractional divider 300 consists of a permutation-and-selection network 304 and a control unit 306 which are operably coupled as shown.

During operation, the permutation-and-selection network 304 receives a plurality of phase input signals $\phi_1, \phi_2, \ldots, \phi_N$ on phase input terminals 308, and outputs an LO signal at its output terminal 310. The input signals $\phi_1, \phi_2, \ldots, \phi_N$ have different phases, but share a common input frequency, $f_{RF}$. In general there can be N input signals, wherein N is a positive integer, and often the phases of the N input signals are equally spaced at 360°/N with respect to one another. For example, when N=4, the RF synthesizer 302 is a quadrature synthesizer that generates input signals having four different phases spaced at 0°, 90°, 180°, 270° but which share a common frequency, $f_{RF}$.

As will be appreciated in more detail with regards to additional examples described further herein, the permutation-and-selection network 304 includes multiple propagation paths extending between each phase input terminal 308 and the LO output terminal 310. These propagation paths can be designed to have precisely the same propagation delay as one another, but in reality only have substantially the same propagation delay but not precisely the same propagation delay as one another because of small manufacturing variations in the propagation paths.

The control unit 306 switches the input signals through the propagation paths in a random order to prevent or limit periodicity in delay mismatch experienced when the signals propagate through permutation-and-selection network 304. Because of the random order in which signals are switched through the propagation paths (and the different delay mismatches for the propagation paths), the order in which the propagation paths are switched is non-periodic. Because periodicity is broken, fractional spurs are prevented, which helps to limit the intensity of noise.

Compared to conventional fractional division techniques, and compared to calibration to correct the delay mismatch, the proposed techniques have several advantages. First, variations of the delay mismatch with time (e.g. due to a temperature drift) pose no problem, as mismatch scrambling is independent of the actual delay values. Second, no dedicated re-calibration time is required if the delay mismatch changes. And third, as the permutation network would typically be implemented using multiplexer and/or de-multiplexer (see FIGS. 4 and 6), mismatch scrambling can be readily used for a large number of phases.

Figure 4:
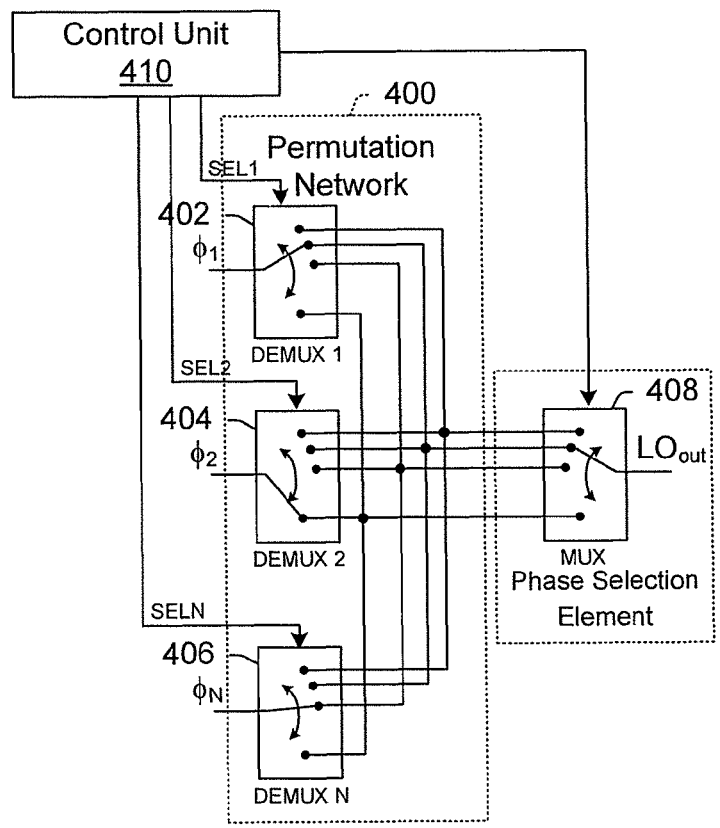
FIG. 4 illustrates a more detailed example of a fractional frequency divider in accordance with some aspects of the disclosure.

An exemplary embodiment of a phase-rotating fractional divider with phase permutation is shown in FIG. 4, wherein the RF synthesizer has been omitted from this figure for ease of viewing. In FIG. 4, the permutation network 400 consists of N de-multiplexers (DEMUX) 402-406, each of which is connected to one of the N input signals $\phi_1, \phi_2, \ldots \phi_N$. The outputs of all DEMUXs 402-406 are connected to one another in respective fashion, and are input to respective input terminals of the phase-selection MUX 408. Each DEMUX 402-406 has a selection signal SEL which is controlled by the control unit 410. The selection signal for a DEMUX selects which of the N outputs the DEMUX input signal is routed to.

Figure 5A:
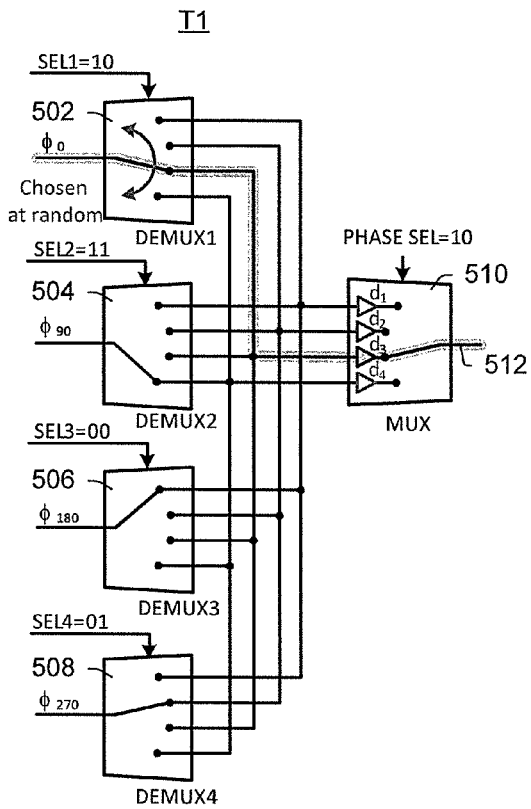
FIGS. 5A-5C illustrate a more detailed example of a fractional frequency divider in accordance with some aspects of the disclosure.
Figure 5B:
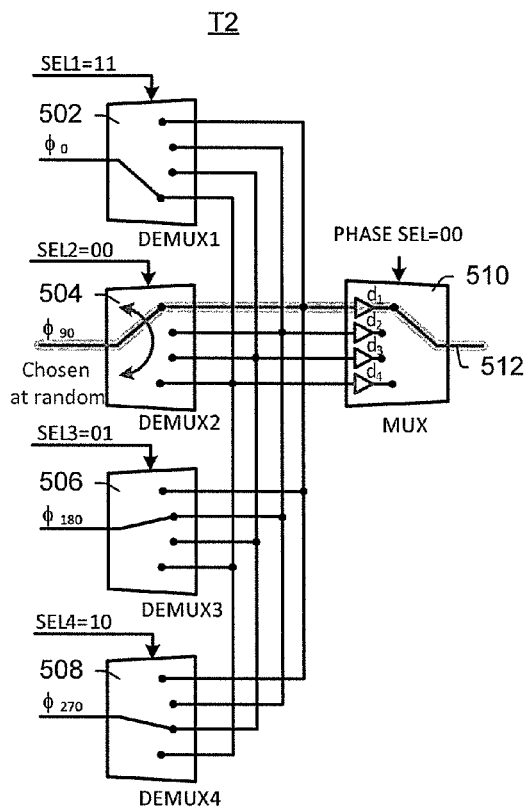
Figure 5C:
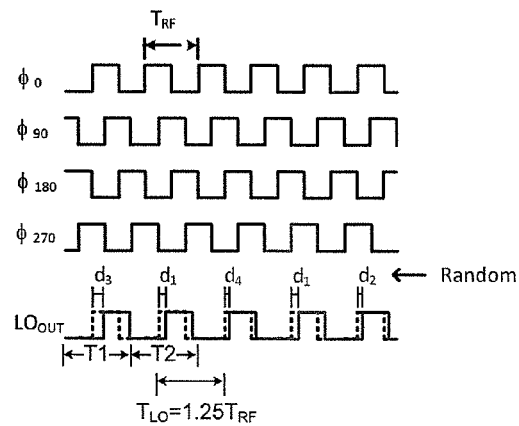

The detailed operation of the permutation network in FIG. 4 is now explained with reference to FIGS. 5A-5C, which sets forth an example that implements a fractional divider-by-1.25 with delay mismatch in a quadrature modulation scheme. In an exemplary stochastic algorithm for delay-mismatch scrambling, phase error periodicity (which can lead to fractional spurs) is prevented or limited by randomly permuting the order in which the phases are passed through the MUX 510. FIGS. 5A-5C illustrate the random permutation for the first two phases $\phi_0$ and $\phi_{90}$, but other phases can be similarly randomly permuted.

When phase $\phi_0$ is to be delivered to the LO output (FIG. 5A and time T1 in FIG. 5C), one of the four taps (outputs) of DEMUX1 502 is chosen at random, which in the figure happens to be tap 3 (SEL1=10). This requires selecting the same tap for the MUX 510 (PHASE SEL=10), while taps selected for all other DEMUX 504, 506, 508 are different but otherwise arbitrary.

Next when phase $\phi_{90}$ shall be passed through the MUX 510 (FIG. 5B and time T2 in FIG. 5C), one of the four taps of DEMUX2 504 is chosen at random (tap 1 in the figure), requiring the same tap-selection for the MUX 510 (PHASE SEL=00) but different tap-selections for all other DEMUX 502, 506, 508. This mechanism is continued with all other phases in a sequential manner.

Now, if the random selections of DEMUX taps are mutually uncorrelated, then the phase-error sequence due to delay mismatch appearing at the output 512 will also be uncorrelated. Thus, for example, the delay mismatch shown in FIG. 5C is the following random sequence:

$d_3, d_1, d_4, d_1, d_2, \ldots$ corresponding to broad-band noise. Because the delay mismatches are chosen randomly in this example, the noise will be spread rather than "spiking" at any particular frequency to limit generation of fractional spurs.

In another algorithm for delay-mismatch scrambling, the control unit (410, FIG. 4) is designed to achieve spectral shaping of delay mismatch-induced noise, which would be advantageous if reduced noise close to the LO frequency is required but increased far-off noise is tolerable or could be filtered. Such spectrally shaped mismatch noise can be realized using, for example, sigma-delta techniques.

Figure 6:
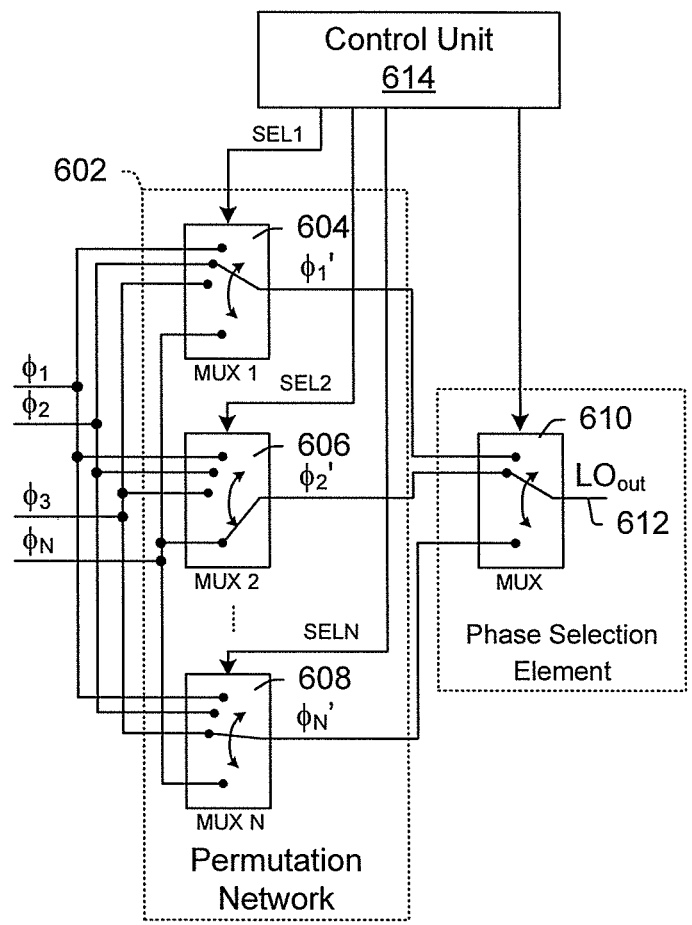
FIG. 6 illustrates a more detailed example of a fractional frequency divider in accordance with some aspects of the disclosure.

Another embodiment of a fractional divider 600 having a permutation network 602 is shown in FIG. 6. Rather than using de-multiplexers as previously described with reference to FIGS. 4-5, this permutation network 602 consists of a plurality of multiplexers 604-608 which may have advantages in a circuit implementation. Each multiplexer includes: a first multiplexer input terminal to receive a first input phase signal $\phi_1$, a second multiplexer input terminal to receive a second input phase signal $\phi_2$, and an Nth multiplexer input terminal to receive an Nth input phase signal $\phi_N$. The multiplexers 604-608 also have respective individual permuted phase output terminals to provide permuted phase output signals $\phi_1'$-$\phi_N'$, respectively. The permuted phase output terminals are coupled to respective input terminals of phase selection multiplexer 610.

Somewhat akin to the example described in FIGS. 2A-2B, the phase selection multiplexer 610 rotates through different phases in time in a pre-determined manner to achieve fractional division. For example, the phase selection multiplexer 610 can rotate $\phi_1, \phi_2, \phi_3, \ldots, \phi_N, \phi_1, \phi_2, \phi_3, \ldots, \phi_N$ in periodic fashion through to LO output terminal 612. To limit or prevent fractional spurs due to periodic delay mismatch, the control unit 614 provides random select signals to control terminals of the permutation multiplexers 604-608. Thus, although the order of rotation of the phases delivered to output terminal 612 is switched through phase selection multiplexer 610 according to a pre-determined algorithm, the phase delays for each phase changes randomly in time. For example, although the first terminal of phase selection multiplexer 610 is tied to the first multiplexer 604 (and thus tied to $\phi_1$, e.g., 0° phase offset), the actual delay mismatch present in $\phi_1'$ is randomly selected based on SEL1. Similarly, although the second terminal of phase selection multiplexer 610 is tied to the second multiplexer 606 (and thus tied to $\phi_2$, e.g., 90° phase offset), the actual delay mismatch present in $\phi_2'$ is randomly selected based on SEL2.

Again, because of the randomized delay mismatches used in FIG. 6, the fractional divider 600 limits or prevents fractional spurs from occurring.

Figure 7:
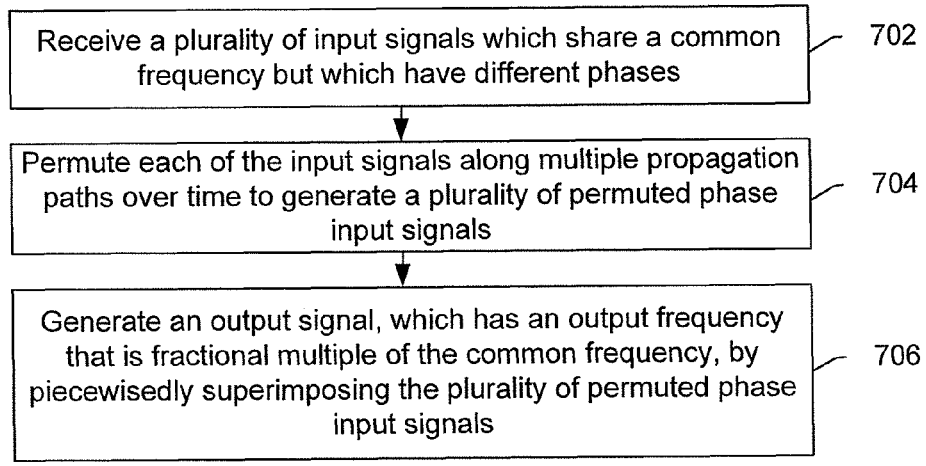
FIG. 7 illustrates a flow chart of a method for generating a radio frequency signals.
Figure 8:
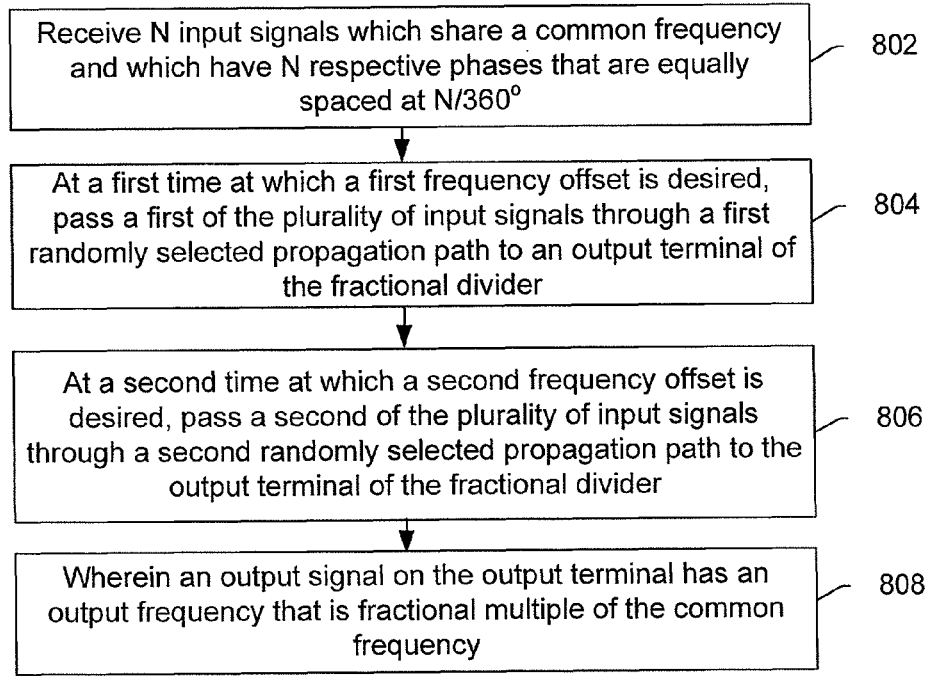
FIG. 8 illustrates a flow chart of another method for generating a radio frequency signals.

FIGS. 7-8 are flow diagrams of some embodiments of methods for synthesizing RF frequencies. While the disclosed methods are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

FIG. 7's method starts at 702, where a fractional frequency divider receives a plurality of input signals. These input signals share a common frequency but have different phases.

In 704, each of the input signals is permuted along multiple propagation paths over time to generate a plurality of permuted phase input signals.

At 706, the fractional frequency divider piecewisely superimposes the plurality of permuted phase input signals on an output terminal of the fractional divider to generate an output signal. The output signal has an output frequency that is fractional multiple of the common frequency.

FIG. 8's method 800 starts at 802, where a fractional divider receives N input signals which share a common frequency and which have N respective phases that are equally spaced at N/360°.

At 804, at a first time at which a first frequency offset is desired, a first of the plurality of input signals are passed through a first randomly selected propagation path to an output terminal of the fractional divider.

At 806, at a second time at which a second frequency offset is desired, a second of the plurality of input signals are passed through a second randomly selected propagation path to the output terminal of the fractional divider. An output signal on the output terminal has an output frequency that is fractional multiple of the common frequency.

It will be appreciated that equivalent alterations and/or modifications may occur to those skilled in the art based upon a reading and/or understanding of the specification and annexed drawings. The disclosure herein includes all such modifications and alterations and is generally not intended to be limited thereby. For example, although several examples have been illustrated above where a fractional frequency divider is included in a wireless transmitter, fractional frequency dividers in accordance with this disclosure can also be used in wireless receivers and/or wireless transceivers. Whereas the fractional frequency dividers in a wireless transmitter provides an LO signal to a transmission path to up-convert a baseband signal to RF for wireless transmission; a fractional frequency divider in a wireless receiver provides an LO signal to a reception path to down-convert a received RF signal to an intermediate frequency or a baseband frequency. Some embodiments of the present disclosure relate to a fractional divider for frequency generation. The fractional divider includes a permutation network including a plurality of phase input terminals and a plurality of permuted phase output terminals with a plurality of propagation paths extending therebetween. Multiple propagation paths extend between a phase input terminal and a permuted phase output terminal. A control unit switches an input signal on the phase input terminal through the multiple propagation paths in time to produce a permuted phase signal on the permuted phase output terminal. A phase selection element individually switches the permuted phase output terminals to an output terminal of the fractional divider in time to generate an output signal. The output signal has an output frequency that is a non-unity fraction of an input frequency of the input signal.

While a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. A fractional divider for frequency generation, comprising:
   a permutation network including a plurality of phase input terminals and a plurality of permuted phase output terminals, wherein multiple propagation paths extend between the phase input terminals and a permuted phase output terminal;
   a control unit configured to switch an input signal on one of the plurality of the phase input terminals randomly through a select one of the multiple propagation paths in time to produce a permuted phase signal on one of the plurality of permuted phase output terminals; and
   a phase selection element configured to individually switch the permuted phase output terminals to an output terminal of the fractional divider in time to generate an output signal having an output frequency that is a non-unity fraction of an input frequency of the input signal.

2. The fractional divider of claim 1, wherein the non-unity fraction is a non-integer value.

3. The fractional divider of claim 1, wherein the multiple propagation paths have substantially the same, but not precisely the same, propagation times.

4. The fractional divider of claim 1, wherein the permutation network has N phase input terminals to receive N input signals having N phases, respectively, wherein the N phases are equally spaced at 360°/N with respect to one another, wherein N is a positive integer.

5. The fractional divider of claim 4, wherein the phase selection element cycles through the N input signals according to a pre-determined pattern so the N input signals are individually and periodically passed through to the output terminal in time.

6. The fractional divider of claim 5:
wherein the control unit, for a first cycle, is configured to switch one input signal on one of the plurality of phase input terminals through a first, randomly chosen propagation path in the permutation network; and
wherein the control unit, for a second cycle, is configured to switch the one input signal on the one of the plurality of phase input terminals through a second, randomly chosen propagation path in the permutation network.

7. The fractional divider of claim 1, wherein the permutation network comprises:
a plurality of de-multiplexers coupled to the plurality of phase input terminals, respectively, and to provide de-multiplexed signals to the permuted phase output terminals.

8. The fractional divider of claim 7, wherein the phase selection element comprises:
a phase selection multiplexer to selectively switch the de-multiplexed signals to the output terminal of the fractional divider.

9. The fractional divider of claim 1, wherein the permutation network comprises:
a plurality of multiplexers coupled to the plurality of phase input terminals, respectively, and to provide multiplexed signals to the permuted phase output terminals.

10. The fractional divider of claim 9, wherein the phase selection element comprises:
a phase selection multiplexer to selectively switch the multiplexed signals to the output terminal of the fractional divider.

11. The fractional divider of claim 10, wherein the control unit randomly switches between the multiplexers and switches the phase selection multiplexer switches according to a pre-determined pattern.

12. A method for frequency generation comprising:
receiving a plurality of input signals which share a common frequency but which have different phases;
permuting each of the input signals by randomly switching each individual input signal through multiple propagation paths over time to generate a plurality of permuted phase input signals; and
generating an output signal, which has an output frequency that is a fractional multiple of the common frequency, by piecewisedly superimposing the plurality of permuted phase input signals on an output terminal of a fractional divider.

13. The method of claim 12, wherein the multiple propagation paths have substantially the same, but not precisely the same, propagation times.

14. A method for frequency generation, comprising:
receiving a plurality of input signals which share a common frequency, wherein the plurality of input signals include N input signals which have N respective phases that are equally spaced at N/360°;
at a first time at which a first frequency offset is desired, passing a first of the plurality of input signals through a first randomly selected propagation path to an output terminal of a fractional divider;
at a second time at which a second frequency offset is desired, passing a second of the plurality of input signals through a second randomly selected propagation path to the output terminal of the fractional divider;
wherein an output signal on the output terminal has an output frequency that is fractional multiple of the common frequency.

15. The method of claim 14, wherein the first and second randomly selected propagation paths have substantially the same, but not precisely the same propagation times.

16. The method of claim 14, further comprising:
at a third time at which a third frequency offset is desired, passing a third of the plurality of input signals through a third randomly selected propagation path to the output terminal of the fractional divider; and
at a fourth time at which a fourth frequency offset is desired, passing a fourth of the plurality of input signals through a fourth randomly selected propagation path to the output terminal of the fractional divider.

17. The method of claim 16, wherein the first, second, third, and fourth frequency offsets are equally spaced at 90° relative to one another.

18. The method of claim 16, wherein the output terminal is configured to be coupled to a local oscillator terminal of a transmission path or reception path.

* * * * *